United States Patent
Joshi et al.

(10) Patent No.: US 7,902,088 B2
(45) Date of Patent: Mar. 8, 2011

(54) HIGH QUANTUM EFFICIENCY SILICON NANOPARTICLE EMBEDDED $SiO_XN_Y$ LUMINESCENCE DEVICE

(75) Inventors: Pooran Chandra Joshi, Vancouver, WA (US); Jiandong Huang, Vancouver, WA (US); Apostolos T. Voutsas, Portland, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 237 days.

(21) Appl. No.: 12/249,911

(22) Filed: Oct. 11, 2008

(65) Prior Publication Data

US 2009/0033207 A1 Feb. 5, 2009

Related U.S. Application Data

(63) Continuation-in-part of application No. 12/187,605, filed on Aug. 7, 2008, which is a continuation-in-part of application No. 12/126,430, filed on May 23, 2008, which is a continuation-in-part of application No. 11/418,273, filed on May 4, 2006, now Pat. No. 7,544,625, which is a continuation-in-part of application No. 11/327,612, filed on Jan. 6, 2006, now Pat. No. 7,723,242, and a continuation-in-part of application No. 11/013,605, filed on Dec. 15, 2004, now Pat. No. 7,446,023, and a continuation-in-part of application No. 10/801,377, filed on Mar. 15, 2004, now Pat. No. 7,122,487, and a continuation-in-part of application No. 11/139,726, filed on May 26, 2005, now Pat. No. 7,381,595, and a continuation-in-part of application No. 10/871,939, filed on Jun. 17, 2004, now Pat. No. 7,186,663, and a continuation-in-part of application No. 10/801,374, filed on Mar. 15, 2004, now Pat. No. 7,087,537.

(51) Int. Cl.
*H01L 21/31* (2006.01)
*H01L 21/469* (2006.01)
*H01J 1/62* (2006.01)
*H01J 63/04* (2006.01)

(52) U.S. Cl. .......... 438/786; 438/787; 438/791; 313/503
(58) Field of Classification Search .................. 438/786, 438/787, 788, 791, 792; 313/503; 427/66
See application file for complete search history.

(56) References Cited

U.S. PATENT DOCUMENTS

| 6,483,861 | B2 | 11/2002 | Moon |
| 6,710,366 | B1 | 3/2004 | Lee et al. |
| 2004/0106285 | A1 | 6/2004 | Zacharias |
| 2006/0180817 | A1* | 8/2006 | Hsu et al. ........................ 257/79 |

FOREIGN PATENT DOCUMENTS

EP 1315508 10/2003

OTHER PUBLICATIONS

Ferraioli et al., "Dielectric matrix influence on the photoluminescence properties of silicon nanocrystals", Sep. 13-15, 2006, IEEE, p. 225-227.* Castagna et al., "High efficiency light emission devices in Si", Mat. Res. Soc. Symp. Proc., vol. 770, p. 12.1.1 (2003).

* cited by examiner

*Primary Examiner* — Walter L Lindsay, Jr.
(74) *Attorney, Agent, or Firm* — Law Office of Gerald Maliszewski; Gerald Maliszewski

(57) ABSTRACT

A method is provided for fabricating a high quantum efficiency silicon (Si) nanoparticle embedded $SiO_XN_Y$ film for luminescence (electroluminescence—EL and photoluminescence—PL) applications. The method provides a bottom electrode, and deposits a Si nanoparticle embedded non-stoichiometric $SiO_XN_Y$ film, where (X+Y<2 and Y>0), overlying the bottom electrode. The Si nanoparticle embedded $SiO_XN_Y$ film is annealed. The annealed Si nanoparticle embedded $SiO_XN_Y$ film has an extinction coefficient (k) of less than about 0.001 as measured at 632 nanometers (nm), and a PL quantum efficiency (PLQE) of greater than 20%.

28 Claims, 7 Drawing Sheets

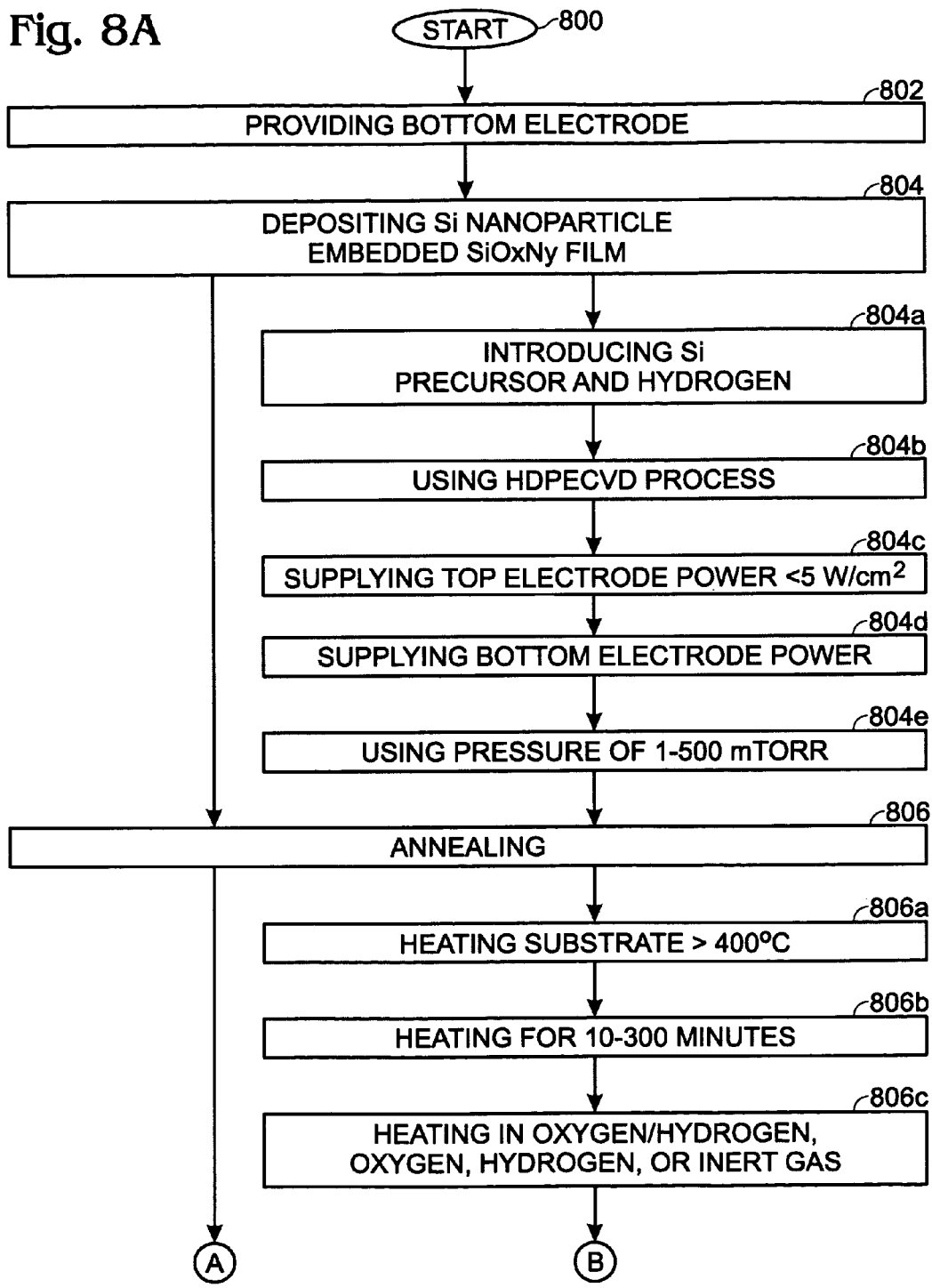

HIGH QUANTUM EFFICIENCY SILICON NANOPARTICLE EMBEDDED $SiO_xN_y$ LUMINESCENCE DEVICE

RELATED APPLICATIONS

This application is a Continuation-in-part of a pending patent application entitled, FABRICATION OF A SEMICONDUCTOR NANOPARTICLE EMBEDDED INSULATING FILM ELECTROLUMINESCENCE DEVICE, invented by Pooran Joshi et al., Ser. No. 12/187,605, filed Aug. 7, 2008, which is a Continuation-in-Part of:

a pending patent application entitled, LIGHT EMITTING DEVICE WITH A NANOCRYSTALLINE SILICON EMBEDDED INSULATOR FILM, invented by Huang et al., Ser. No. 12/126,430, filed May 23, 2008, which is a Continuation-in-Part of:

a pending patent application entitled, SILICON OXIDE THIN-FILMS WITH EMBEDDED NANOCRYSTALLINE SILICON, invented by Pooran Joshi et al., Ser. No. 11/418,273, now U.S. Pat. No. 7,544,625 filed May 4, 2006, which is a Continuation-in-Part of the following applications:

ENHANCED THIN-FILM OXIDATION PROCESS, invented by Pooran Joshi et al., Ser. No. 11/327,612, filed Jan. 6, 2006 now U.S. Pat. No. 7,723,242;

HIGH-DENSITY PLASMA HYDROGENATION, invented by Pooran Joshi et al., Ser. No. 11/013,605, filed Dec. 15, 2004 now U.S. Pat. No. 7,446,023;

DEPOSITION OXIDE WITH IMPROVED OXYGEN BONDING, invented by Pooran Joshi, Ser. No. 10/801,377, filed Mar. 15, 2004 now U.S. Pat. No. 7,122,487;

HIGH-DENSITY PLASMA OXIDATION FOR ENHANCED GATE OXIDE PERFORMANCE, invented by Joshi et al., Ser. No. 11/139,726, filed May 26, 2005 now U.S. Pat. No. 7,381,595;

HIGH-DENSITY PLASMA PROCESS FOR SILICON THIN-FILMS, invented by Pooran Joshi, Ser. No. 10/871,939, filed Jun. 17, 2004 now U.S. Pat. No. 7,186,663;

METHOD FOR FABRICATING OXIDE THIN-FILMS, invented by Joshi et al., Ser. No. 10/801,374, filed Mar. 15, 2004 now U.S. Pat. No. 7,087,537.

All the above-referenced applications are incorporated herein by reference.

BACKGROUND OF THE INVENTION

1. Field of the Invention

This invention generally relates to the fabrication of integrated circuit (IC) electroluminescence (EL) and photoluminescence (PL) devices, and more particularly, to a luminescence device made from a silicon (Si) nanoparticle embedded $SiO_xN_y$ film, with a high PL quantum efficiency (QE).

2. Description of the Related Art

The fabrication of integrated optical devices involves the deposition of materials with suitable optical characteristics such as absorption, transmission, and spectral response. Thin-film fabrication techniques can produce diverse optical thin films, which are suitable for the production of large area devices at high throughput and yield. Some optical parameters of importance include refractive index (n) and the optical band-gap, which dictate the transmission and reflection characteristics of the thin film.

Typically, bilayer or multilayer stack thin-films are required for the fabrication of optical devices with the desired optical effect. Various combinations of the metal, dielectric, and/or semiconductor layers are also used to form multilayer films with the desired optical characteristics. The selection of the material depends on the target reflection, transmission, and absorption characteristics. While a single layer device would obviously be more desirable, no single thin-film material has been able to provide the wide range of optical dispersion characteristics required to get the desired optical absorption, band-gap, refractive index, reflection, or transmission over a wide optical range extending from ultraviolet (UV) to far infrared (IR) frequencies.

Silicon is the material of choice for the fabrication of optoelectronic devices because of well-developed processing technology. However, the indirect band-gap makes it an inefficient material for optoelectronic devices. Over the years, various R&D efforts have focused on tailoring the optical function of Si to realize Si-based optoelectronics. The achievement of efficient room temperature light emission from the crystalline silicon is a major step towards the achievement of fully Si-based optoelectronics.

The fabrication of stable and reliable optoelectronic devices requires Si nanocrystals with high photoluminescence (PL) and electroluminescence (EL) quantum efficiency. EL is both an optical phenomenon and an electrical phenomenon in which a material emits light in response to an electric current passed through it, or in response to a strong electric field. EL can be distinguished from light emission resulting from heat (incandescence) from the action of chemicals (chemoluminescence), the action of sound (sonoluminescence), or other mechanical action (mechanoluminescence). PL is a process in which a substance absorbs photons (electromagnetic radiation) and then re-radiates photons. Quantum mechanically, PL can be described as an excitation to a higher energy state and then a return to a lower energy state accompanied by the emission of a photon. The period between absorption and emission is typically extremely short, in the order of 10 nanoseconds.

One approach that is being actively pursued for integrated optoelectronic devices is the fabrication of $SiO_x$ ($x \leq 2$) thin films with embedded Si nanocrystals. The luminescence due to recombination of the electron-hole pairs confined in Si nanocrystals depends strongly on the nanocrystal size. The electrical and optical properties of the nanocrystalline Si embedded $SiO_xN_y$ thin films depend on the size, concentration, and distribution of the Si nanocrystals. Various thin-film deposition techniques such as sputtering and plasma-enhanced chemical vapor deposition (PECVD), employing a capacitively-coupled plasma source, are being investigated for the fabrication of stable and reliable nanocrystalline Si thin films, which are also referred to herein as nanocrystalline Si embedded insulating thin films.

Conventional PECVD and sputtering techniques have the limitations of low plasma density, inefficient power coupling to the plasma, low ion/neutral ratio, and uncontrolled bulk, and interface damage due to high ion bombardment energy. Therefore, the oxide films formed from a conventional capacitively-coupled plasma (CCP) generated plasma may create reliability issues due to the high bombardment energy of the impinging ionic species. It is important to control or minimize any plasma-induced bulk or interface damage. However, it is not possible to efficiently control the ion energy using the radio frequency (RF) power of CCP generated plasma. Any attempt to enhance the reaction kinetics by increasing the applied power results in increased bombardment of the deposited film, creating a poor quality films with a high defect concentration. Additionally, the low plasma density associated with these types of sources ($\sim 1 \times 10^8$-$10^9$ $cm^{-3}$) leads to limited reaction possibilities in the plasma and on the film surface, inefficient generation of active radicals and ions for enhanced process kinetics, inefficient oxidation, and process and system induced impurities, which limits their usefulness in the fabrication of low-temperature electronic devices.

The pulsed laser and ion implantation of Si in dielectric thin films has also been extensively investigated for the creation of Si nano-particles. However, the ion implantation approach is not suitable for the uniform distribution of the nc-Si particles across the film thickness. Additionally, the particle agglomeration in Si ion implanted and pulsed laser deposited dielectric films typically leads to red shift of the PL/EL spectrum.

A deposition process that offers a more extended processing range and enhanced plasma characteristics than conventional plasma-based techniques, such as sputtering or PECVD, is required to generate and control the particle size for PL and electroluminescent (EL) based device development. A process that can enhance plasma density and minimize plasma bombardment will ensure the growth of high quality films without plasma-induced microstructural damage. A process that can offer the possibility of controlling the interface and bulk quality of the films independently will enable the fabrication of high performance and high reliability electronic devices. A plasma process that can efficiently generate the active plasma species, radicals and ions, will enable noble thin film development with controlled process and property control.

For the fabrication of high quality SiOx and SiOxNy thin films, the oxidation of a grown film is also critical to ensure high quality insulating layer across the nanocrystalline Si particles. A process that can generate active oxygen radicals at high concentrations will ensure the effective passivation of the Si nanoparticles (nc-Si) in the surrounding oxide matrix. A plasma process that can minimize plasma-induced damage will enable the formation of a high quality interface that is critical for the fabrication of high quality devices. Low thermal budget efficient oxidation and hydrogenation processes are critical and will be significant for the processing of high quality optoelectronic devices. The higher temperature thermal processes can interfere with the other device layers and they are not suitable in terms of efficiency and thermal budget, due to the lower reactivity of the thermally activated species. Additionally, a plasma process which can provide a more complete solution and capability in terms of growth/deposition of novel film structures, oxidation, hydrogenation, particle size creation and control, and independent control of plasma density and ion energy, and large area processing is desired for the development of high performance optoelectronic devices. Also, it is important to correlate the plasma process with the thin film properties as the various plasma parameters dictate the thin film properties and the desired film quality depends on the target application. Some of the key plasma and thin-film characteristics that depend on the target application are deposition rate, substrate temperature, thermal budget, density, microstructure, interface quality, impurities, plasma-induced damage, state of the plasma generated active species (radicals/ions), plasma potential, process and system scaling, and electrical quality and reliability. A correlation among these parameters is critical to evaluate the film quality as the process map will dictate the film quality for the target application. It may not be possible to learn or develop thin-films by just extending the processes developed in low density plasma or other high-density plasma systems, as the plasma energy, composition (radical to ions), system pressure, plasma potential, electron temperature, and thermal conditions correlate differently depending on the process map.

Si nanocrystals with sizes in the range of 1-10 nm have shown enhanced optical and electrical properties due to quantum confinement effects. One challenge in the development of high performance nc-Si embedded thin film based EL devices are the creation and control of the nc-Si particles sizes and distribution, the properties of the inter-particle medium, and the nc-Si particle/dielectric interface quality. EL device efficiency strongly depends on the intrinsic light generation efficiency of the thin film medium, light extraction efficiency, electrical conductivity, and the breakdown field strength of the film. An efficient charge injection at low applied voltages is a factor in fabricating practical EL devices. Generally, it is possible to get higher EL power from nano-particle embedded films by increasing the film thickness. However, the applied voltage to achieve the target EL power also increases. If the film thickness is reduced to attain the same field at lower voltages, then the EL power level decreases due to the lower number of nano-particles available for light generation.

Low temperatures are generally desirable in liquid crystal display (LCD) manufacture, where large-scale devices are formed on transparent glass or plastic substrate. These transparent substrates can be damaged when exposed to temperatures exceeding 650 degrees C. To address this temperature issue, low-temperature Si oxidation processes have been developed. These processes use a high-density plasma source such as an inductively coupled plasma (ICP) source, and are able to form Si oxide with a quality comparable to 1200 degree C. thermal oxidation methods.

It would be advantageous if a nc-Si particle dielectric film could be fabricated to exhibit a larger PL/EL response at shorter wavelengths, such as in the range from 475-700 nm. Conventional PECVD and sputtering techniques have the limitations of low plasma density, inefficient power coupling to the plasma, low ion/neutral ratio, and uncontrolled bulk and interface damage due to high ion bombardment energy. The ion implantation approach is not suitable for the uniform distribution of the nc-Si particles across the film thickness. Additionally, the particle agglomeration in Si ion implanted and pulsed laser deposited dielectric films typically lead to red shift of the PL/EL spectrum.

SUMMARY OF THE INVENTION

The high-density plasma (HDP) process described herein overcomes the limitations associated with the deposition rate, film density, nc-Si particle density and size control, bulk and interfacial defect control, defect passivation, and inter-particle medium quality control, when contrasted to the Si ion implantation approach and various physical and chemical techniques currently being investigated for the fabrication of nc-Si embedded dielectric thin films. The present invention describes a novel process for the fabrication of nc-Si embedded $SiO_xN_y$ thin films exhibiting high optical quantum efficiency. At present, the reported optical quantum efficiency of the nc-Si embedded dielectric thin films is limited to less than 10%. The present invention describes a novel process for the fabrication of nc-Si embedded SiOx thin films with optical quantum efficiency greater than 20%.

The high-density plasma technique has been used for the creation of Si nanocrystals in a $SiO_xN_y$ matrix with PL emission in the wavelength range of 475-900 nm. The HDP deposited $SiO_xN_y$ films have shown PL signal even in the as-deposited state, while subsequent annealing has resulted in a significant enhancement of the PL intensity due to phase separation and quantum confinement effects. The HDP process is suitable for the fabrication of single layer, bilayer, or multilayer structures suitable for optoelectronic applications by sequential processing (in-situ or cluster tool).

Accordingly, a method is provided for fabricating a high quantum efficiency silicon (Si) nanoparticle embedded $SiO_XN_Y$ film for luminescence (electroluminescence—EL and photoluminescence—PL) applications. The method provides a bottom electrode, and deposits a Si nanoparticle embedded non-stoichiometric $SiO_XN_Y$ film, where (X+Y<2 and Y>0), overlying the bottom electrode. The Si nanoparticle embedded, $SiO_XN_Y$ film is annealed. The annealed Si nanoparticle embedded $SiO_XN_Y$ film has an extinction coefficient (k) of less than about 0.001 as measured at 632 nanometers (nm), and a PL quantum efficiency (PLQE) of greater than 20%.

In one aspect, the Si nanoparticle embedded $SiO_XN_Y$ film is deposited by introducing a semiconductor precursor and hydrogen, and using a high density (HD) plasma-enhanced chemical vapor deposition (PECVD) process that supplies power to a top electrode at a frequency in the range of 13.56 to 300 megahertz (MHz), and a power density of less than 5 watts per square centimeter (W/cm$^2$).

Additional details of the above-described method and a luminescence device with a Si nanoparticle embedded $SiO_XN_Y$ film are presented below.

BRIEF DESCRIPTION OF THE DRAWINGS

FIGS. 8A and 8B are a flowchart illustrating a method fabricating a high quantum efficiency Si nanoparticle embedded $SiO_XN_Y$ film for luminescence (EL and PL) applications.

DETAILED DESCRIPTION

Figure 1:
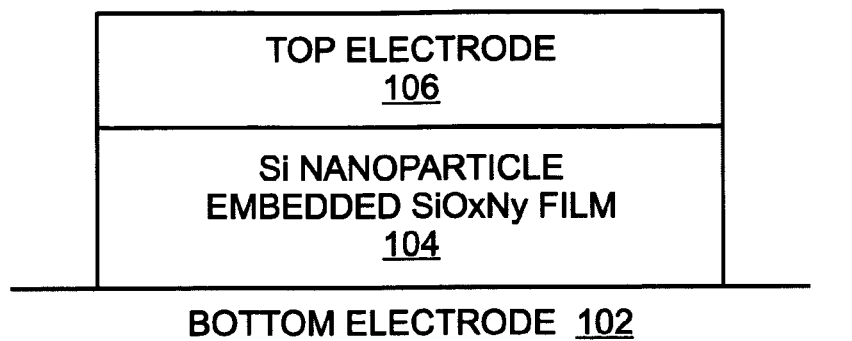
FIG. 1 is a partial cross-sectional view of a high quantum efficiency silicon (Si) nanoparticle embedded $SiO_XN_Y$ film for luminescence (electroluminescence—EL and photoluminescence—PL) applications.

FIG. 1 is a partial cross-sectional view of a high quantum efficiency silicon (Si) nanoparticle embedded $SiO_XN_Y$ film for luminescence (electroluminescence—EL and photoluminescence—PL) applications. The luminescence device 100 comprises a bottom electrode 102. The bottom electrode 102 may be a doped semiconductor, metal, polymer, glass, metalized substrates, or plastic. A Si nanoparticle embedded non-stoichiometric $SiO_XN_Y$ film 104 overlies the bottom electrode, where (X+Y<2 and Y>0). The Si nanoparticle embedded $SiO_XN_Y$ film 104 has a refractive index (n) in a range of about 1.6 to 1.9, as measured at 632 nanometers (nm), and a PL quantum efficiency (QE) of greater than 20%. In some cases the PLQE is greater than 50%. A top electrode 106 overlies the Si nanoparticle embedded $SiO_XN_Y$ film 104. The top electrode 106 may be a thin metal or transparent metal oxide such as indium tin oxide (ITO), for example. Typically, the Si particles have a size in a range of about 1 to 10 nm.

In one aspect, the luminescence device has optical emission/absorption characteristics in the wavelength range of about 475 to 900 nm. Alternately stated, the device 100 has its optical emission/absorption characteristics tuned in the range of about 475 to 900 nm.

In another aspect, the Si nanoparticle embedded $SiO_XN_Y$ film 104 has an extinction coefficient (k) of less than about 0.001, as measured at 632 nm. In some aspects, k is graded. The grading may be continuous, stepped, or cyclic. The graded k may also have a value that varies with the distance of the film from the bottom electrode.

In another aspect not specifically shown, a plurality of $SiO_XN_Y$ films may be formed overlying the bottom electrode. In another aspect (see FIG. 3), the Si nanoparticle embedded $SiO_XN_Y$ film 104 includes a Type 3, Type 4, Type 5, or rare earth elements dopant.

It has been possible to fabricate high performance nc-Si embedded dielectric films by analyzing the key high density plasma process parameters impacting the optical dispersion, nc-Si growth, and size as evidenced in the PL response of the films. The n-k dispersion can be controlled by varying the N/O ratio, as well as the Si richness in the films. The PL response characteristics can be addressed by controlling the nc-Si size, which strongly depends on the system pressure and RF power. However, the correlation among these thin film properties and high density plasma deposition conditions needed to fabricate high performance EL devices operating at low voltages has been, before now, impossible to determine due to the large number of variables.

PLQE is defined herein as the ratio of the photons emitted at longer wavelengths to the number of photons absorbed at shorter wavelengths, and it is a measure of the photo-conversion efficiency of the films. Since the absorption of energy by nc-Si embedded SiOxNy thin films is a function of excitation wavelength, and the energy of a photon is inversely proportional to its wavelength, QE is often measured over a range of different wavelengths to characterize a device's efficiency.

Figure 2:
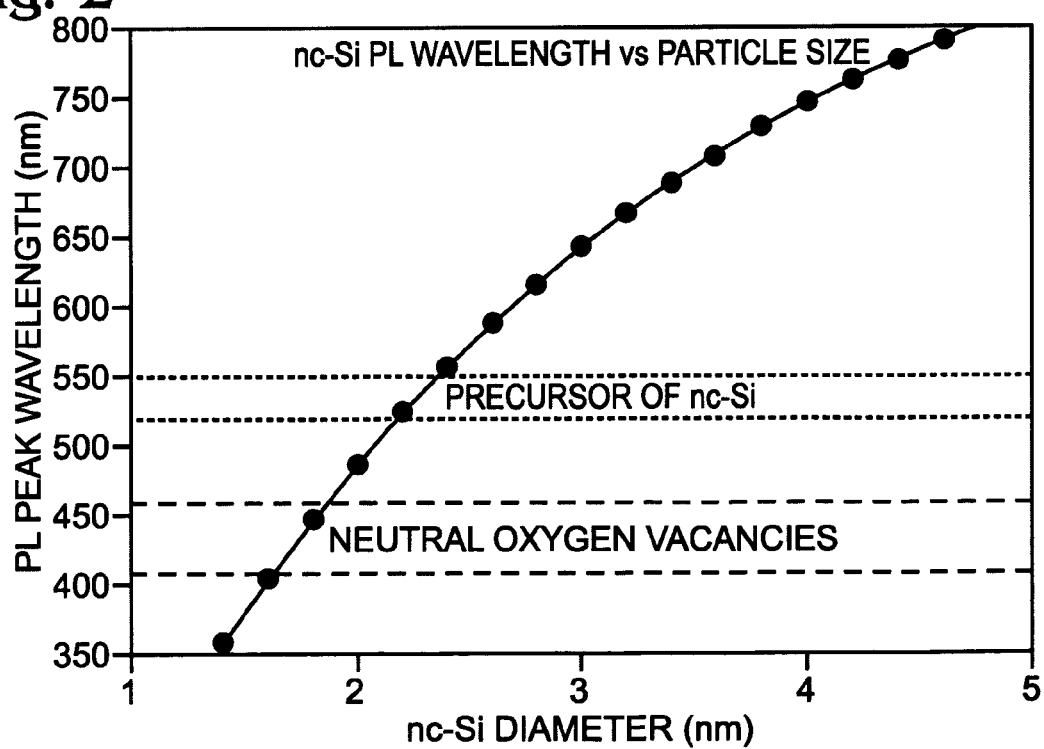
FIG. 2 is a graph depicting the relationship between PL wavelength and silicon nanoparticle size.

FIG. 2 is a graph depicting the relationship between PL wavelength and silicon nanoparticle size. The development of nc-Si embedded $SiO_xN_y$ thin films with PL emissions covering the visible part of the spectrum is attractive for diverse opto-electronic applications. The high-density plasma (HDP) process described below is effective in the creation and control of the nc-Si particles in the range of 1-10 nm.

Some factors that strongly influence optical quantum efficiency and EL device performance are summarized in Table 1. The deposition technique, post-deposition annealing conditions, defect passivation efficiency, and film/electrode interface all play a role in dictating the overall performance of the PL/EL devices.

TABLE 1

Factors influencing the performance of
EL devices employing nc-Si embedded dielectric thin films

| Factors Influencing EL Performance |
| --- |
| nc-Si size and density distribution |
| Inter-particle dielectric material |
| Dielectric medium quality |
| nc-Si/dielectric interface quality |
| non-radiative defect centers and their passivation |
| Optical dispersion characteristics |
| Charge injection efficiency at the interface and in the bulk of the film |

Figure 3:
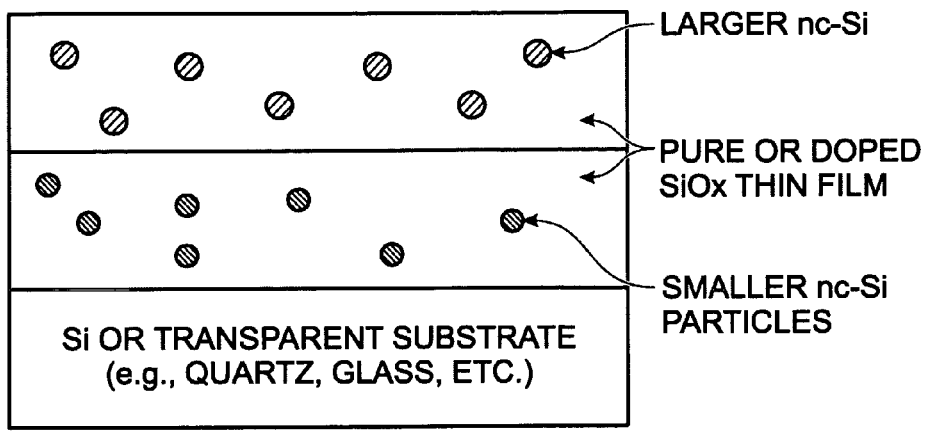
FIG. 3 is a partial cross-sectional view depicting a multilayered luminescence device exhibiting tunable optical emission/absorption characteristics.

FIG. 3 is a partial cross-sectional view depicting a multilayered luminescence device exhibiting tunable optical emission/absorption characteristics. The creation and control of the nc-Si particles emitting at shorter wavelengths in the range of 475-900 nm is desired for the enhancement and control of optical emission from the pure and doped nc-Si embedded SiOx thin films. The nc-Si particles and the dopants can excite each other depending on their PL/EL emission characteristics. As shown, the shorter wavelength emission also enables the fabrication of multilayer structures with effective control of the optical emission in the entire range extending from UV to IR wavelengths.

The high-density PECVD (HDPECVD) process is effective in the low temperature processing of Si nanocrystal films having good PL characteristics, even in the as-deposited state. The HDP technique is attractive for processing high quality Si (amorphous, microcrystalline, polycrystalline, or nanocrystalline), $SiO_2$, $SiN_x$, and stoichiometric and Si rich $SiO_xN_y$ thin films for the fabrication of stable and reliable optoelectronic devices. The HDP-based processes enable the fabrication of high-quality single and multi-layer superlattice structures suitable for the fabrication of efficient and reliable optoelectronic devices. The fabrication of electroluminescent devices based on the photo-emission characteristics of nanocrystalline Si will dictate the development of high performance and cost-effective integrated optoelectronic devices. Another application of the $SiO_xN_y$ thin films is in flash memory. The nc-Si embedded dielectric films can serve the dual purposes of charge trapping and light emission.

Figure 4:
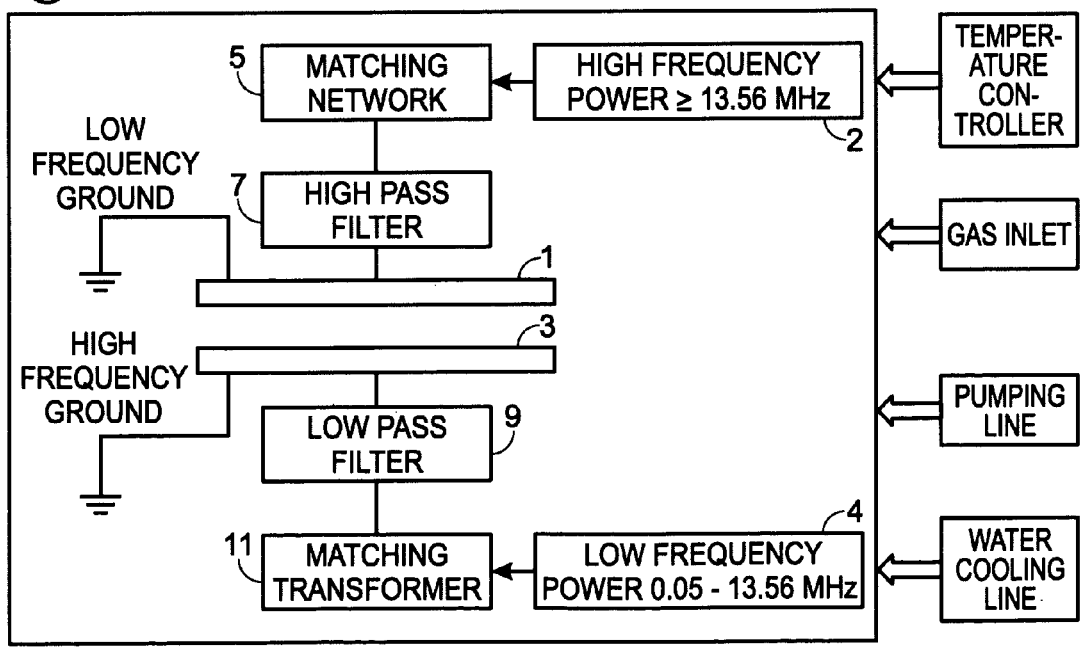
FIG. 4 is a schematic drawing of a high-density plasma (HDP) system with an inductively coupled plasma source.

FIG. 4 is a schematic drawing of a high-density plasma (HDP) system with an inductively coupled plasma source. The top electrode 1 is driven by a high frequency radio frequency (RF) source 2, while the bottom electrode 3 is driven by a lower frequency power source 4. The RF power is coupled to the top electrode 1, from the high-density inductively coupled plasma (ICP) source 2, through a matching network 5 and high pass filter 7. The power to the bottom electrode 3, through a low pass filter 9 and matching transformer 11, can be varied independently of the top electrode 1. The top electrode power frequency can be in the range of about 13.56 to about 300 megahertz (MHz) depending on the ICP design. The bottom electrode power frequency can be varied in the range of about 50 kilohertz (KHz) to about 13.56 MHz, to control the ion energy. The pressure can be varied up to 500 mTorr. The top electrode power can be as great as about 10 watts per square-centimeter ($W/cm^2$), although the above-described semiconductor nanocrystal embedded Si insulating films are typically formed using a top electrode power of less than 5 $W/cm^2$. The bottom electrode power can be as great as about 3 $W/cm^2$.

One interesting feature of the HDP system is that there are no inductive coils exposed to the plasma, which eliminates any source-induced impurities. The power to the top and bottom electrodes can be controlled independently. There is no need to adjust the system body potential using a variable capacitor, as the electrodes are not exposed to the plasma. That is, there is no crosstalk between the top and bottom electrode powers, and the plasma potential is low, typically less than 20 V. System body potential is a floating type of potential, dependent on the system design and the nature of the power coupling.

The HDP tool is a true high-density plasma process with an electron concentration of greater than $1 \times 10^{11}$ $cm^{-3}$, and the electron temperature is less than 10 eV. There is no need to maintain a bias differential between the capacitor connected to the top electrode and the system body, as in many high-density plasma systems and conventional designs such as capacitively-coupled plasma tools. Alternately stated, both the top and bottom electrodes receive RF and low frequency (LF) powers.

The key optical parameters of the nc-Si embedded $SiO_x$ thin films are summarized in Table 2. The HDP process described in this invention is effective in controlling the optical dispersion characteristics of the nc-Si embedded $SiO_x$ thin films. It is possible to tune the optical dispersion characteristics over a wide range for films with PL emission covering a wide range of the visible part of the spectrum. It is possible to vary n and k independently by tuning the process for films with similar PL emission wavelength. Based on optimization, it has been established that the following n and k dispersion characteristics are important in the fabrication of the high optical QE thin films with PLQE exceeding 20%.

TABLE 2

The optical dispersion characteristics of the films exhibiting high PL quantum efficiency exceeding 10%.

| Parameter | Range |
| --- | --- |
| Refractive Index (at 632 nm) | 1.60-1.90 |
| Extinction Coefficient (at 632 nm) | <0.001 |
| PL Quantum Efficiency | >20% |

The creation and control of the nc-Si particle size, density, and distribution is a factor in the fabrication of high performance optoelectronic devices. $H_2$ gas in the plasma is very effective in controlling the nc-Si size and optical dispersion characteristics. The combination of the various-processes described herein is effective in the creation of nc-Si particles exhibiting PL response in the wavelength range of 475-900 nm. $SiO_xN_y$ thin film properties are controlled by varying the gas flow rate and ratios, RF power, system pressure, and substrate temperature. The deposition process is optimized in terms of the optical, PL, and EL emission characteristics of the $SiO_xN_y$ thin films. The various gas combinations and the flow ratios, which are effective in the fabrication of high quality nc-Si embedded $SiO_xN_y$ thin films, are described in Table 3.

TABLE 3

The various gas combinations and flow ratios
suitable for the fabrication of high PL QE thin films.

| Gas Combination | $SiH_4/N_2O$ | $H_2/SiH_4$ | Inert Gas/$SiH_4$ | $N_2O/H_2$ | Inert Gas/$H_2$ |
|---|---|---|---|---|---|
| $SiH_4 + N_2O^* + H_2$ | 0.1-10 | 0.02-100 | 0-10 | 0.02-20 | 0-40 |
| $SiH_4 + N_2O^* + N_2 + H_2$ | | | | | |
| $SiH_4 + N_2O^* + H_2 +$ Noble Inert Gases | | | | | |

*$N_2O$ can be replaced by any oxygen source gas. If replaced with $O_2$, the same ranges apply.

Details of HDP process conditions for the fabrication of stoichiometric and Si rich $SiO_xN_y$ thin films are detailed in Table 4.

TABLE 4

High density plasma processing of $SiO_xN_y$ thin films

| Top Electrode Power | 13.56-300 MHz, <5 W/cm², |
| Bottom Electrode Power | 50 KHz-13.56 MHz, <3 W/cm² |
| Pressure | 1-500 mTorr |
| Temperature | 25-300° C. |
| Film Thickness (nm) | 5 nm-1 μm |

Table 5 shows the effect of $H_2$ flow on the refractive index of the $SiO_xN_y$ thin films deposited at an RF power of 1500 W and system pressure of 75 mTorr. The refractive index increases with an increase in the hydrogen flow, leading to an increased nc-Si particle size, which indicates an increase in the Si richness of the films. Similar relationships are observed in the processes listed in Table 3.

TABLE 5

Effect of $H_2$ flow on the refractive index of $SiO_xN_y$ thin films

| $SiH_4$ (sccm) | $N_2O$ (sccm) | $H_2$ (sccm) | n @ 632 nm |
|---|---|---|---|
| 5 | 5 | 250 | 1.774 |
| 5 | 5 | 325 | 1.793 |
| 5 | 5 | 400 | 1.817 |
| 5 | 5 | 475 | 1.852 |

Figure 5A:
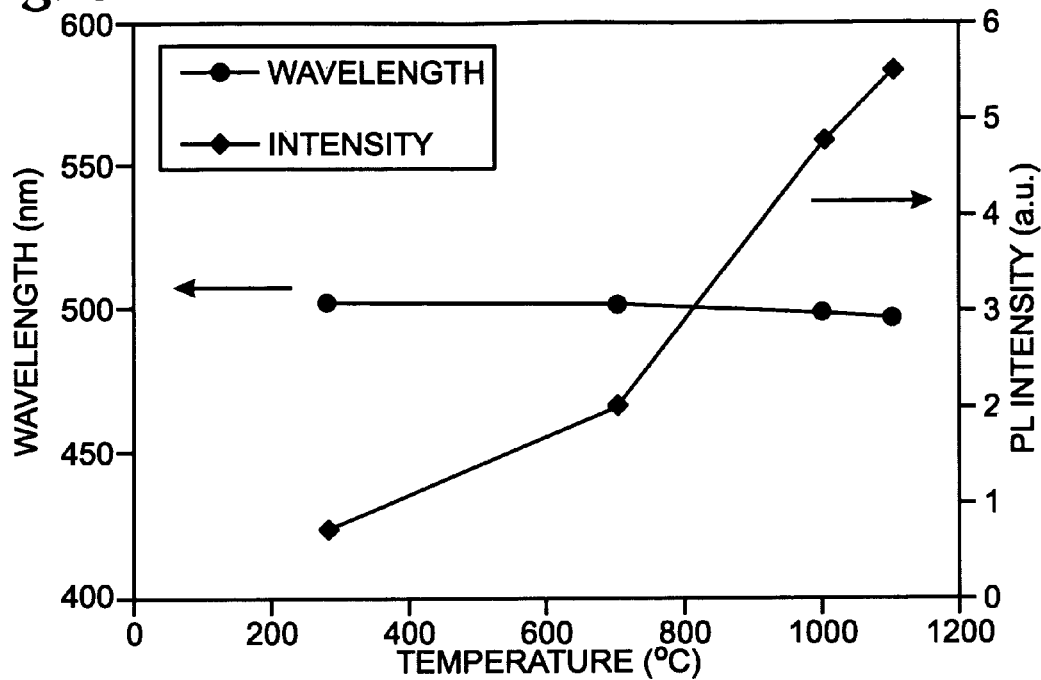
FIGS. 5A and 5B depict the effect of the annealing temperature on the PL response (FIG. 5A) and the PL spectra of the films as a function of the rapid thermal annealing temperature (FIG. 5B).
Figure 5B:
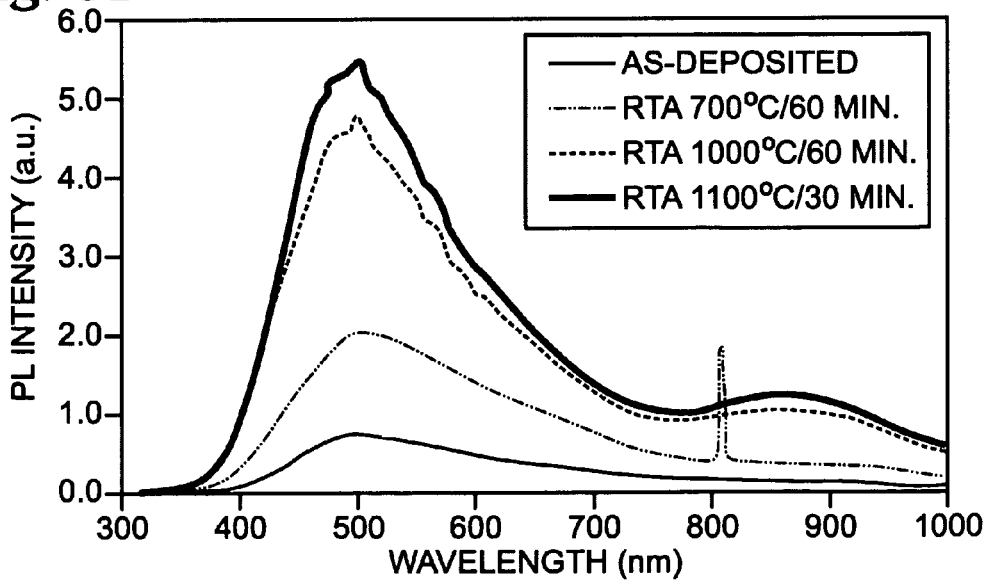

FIGS. 5A and 5B depict the effect of the annealing temperature on the PL response (FIG. 5A) and the PL spectra of the films as a function of the rapid thermal annealing temperature (FIG. 5B). The films were deposited at a $SiH_4/N_2O/H_2$ ratio of 15/15/150 sccm. The applied RF power, system pressure, and substrate temperature were 700 W, 75 mTorr, and 280° C., respectively. As shown in FIG. 5A, the PL emission wavelength is maintained at around 500 nm for the as-deposited and annealed films. FIG. 5B shows a well defined PL peak at 500 nm.

Figure 6:
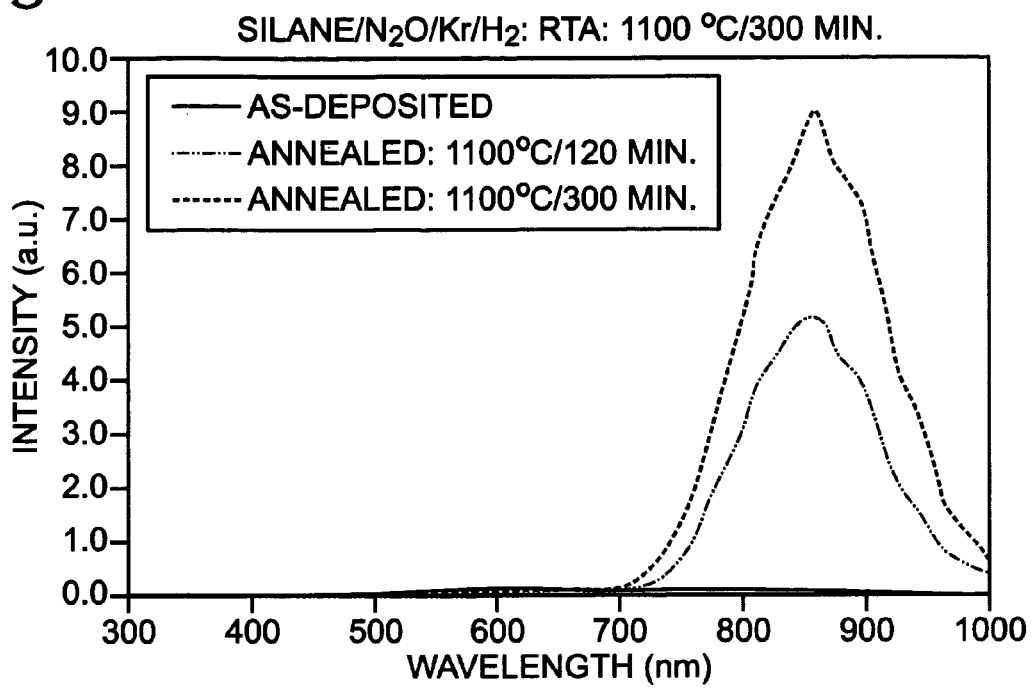
FIG. 6 is a graph depicting PL emission characteristics of films deposited using a combination of $SiH_4/N_2O/Kr/H_2$.

FIG. 6 is a graph depicting PL emission characteristics of films deposited using a combination of $SiH_4/N_2O/Kr/H_2$. The combination of the inert gas and hydrogen are very effective in the creation of larger nc-Si particles; especially, ones exhibiting PL response in the range of 800-900 nm.

Figure 7:
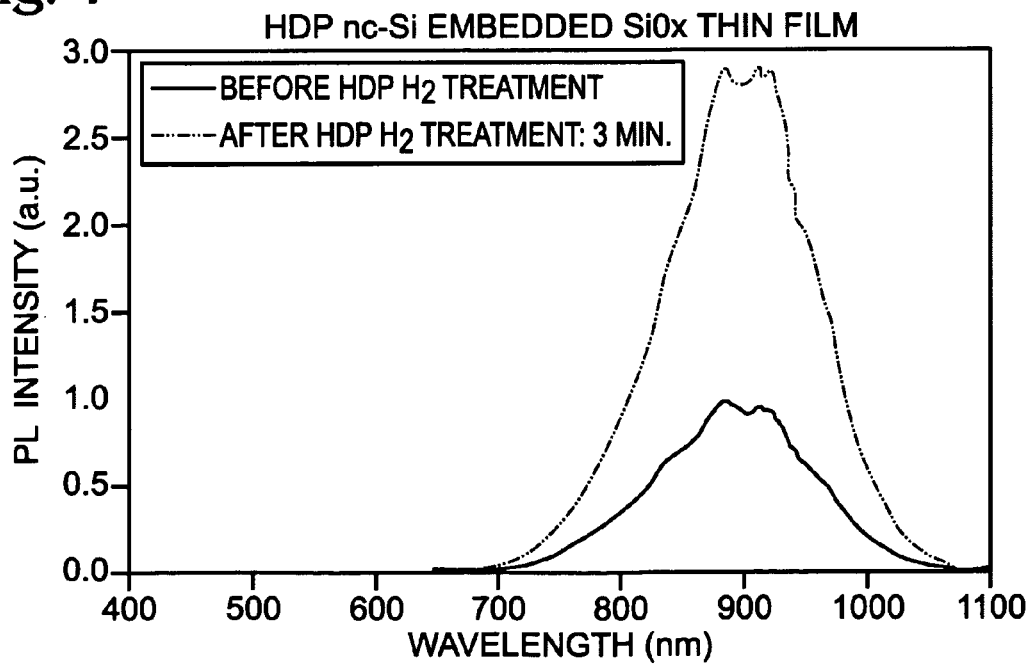
FIG. 7 depicts the effect of hydrogen defect passivation on the PL response of a film with a peak emission wavelength of about 880 nm.

FIG. 7 depicts the effect of hydrogen defect passivation on the PL response of a film with a peak emission wavelength of about 880 nm. A high-density plasma hydrogenation process is attractive for an efficient low temperature and low thermal budget passivation of defects and dangling bonds in the deposited Si, $SiO_xN_y$ and $SiO_2$ thin films. Table 6 summarizes the high-density plasma processing conditions suitable for the efficient hydrogenation of thin films.

TABLE 6

High density plasma hydrogenation process range

| Top Electrode Power | 13.56-300 MHz, up to 10 W/cm², |
| Bottom Electrode Power | 50 KHz-13.56 MHz, up to 3 W/cm² |
| Pressure | 1-500 mTorr |
| Gases: General | $H_2$ + Any suitable Inert Gas |
| Gases: Specific Process | $H_2$ |
| Temperature | 25-300° C. |
| Time | 30 s-60 min |

The presence of an appreciable PL signal in the as-deposited thin film shows the potential of the HDP process in creating Si nanocrystals, even at temperatures lower than 400° C. The PL emission characteristics of the $SiO_xN_y$ thin films can be further enhanced by thermal treatment in a suitable ambient. The high-temperature annealing results in a separation of the $SiO_xN_y$ phase into Si clusters or nanocrystals separated by a dielectric matrix. The annealing temperature/time can be correlated with other thin-film deposition process conditions and properties so that the Si cluster size, concentration, and distribution can be varied. Exemplary annealing conditions are listed in Table 7.

TABLE 7

Post-deposition thermal annealing range
for nc-Si embedded $SiO_xN_y$ thin films.

| Temperature Range | 600-1100° C. |
| Time | 10-60 min |
| Ambient | Inert gas/$H_2$ |

As used herein, a nc-Si embedded $SiO_xN_y$ (x+y<2) thin film is also referred to as a non-stoichiometric $SiO_XN_Y$ thin-film, where (X+Y<2 and Y>0). A non-stoichiometric $SiO_XN_Y$ thin-film, as used herein, is understood to be a film with Si nanoparticles (nc-Si), and may also be referred to as a Si-rich $SiO_XN_Y$ thin-film. The term "non-stoichiometric" as used herein retains the meaning conventionally understood in the art as a chemical compound with an elemental composition that cannot be represented by a ratio of well-defined natural numbers and is, therefore, in violation of the law of definite proportions. Conventionally, a non-stoichiometric compound is a solid that is understood to include random defects, resulting in the deficiency of one element. Since the compound needs to be overall electrically neutral, the missing atom's charge requires compensation in the charge for another atom in the compound, by either changing the oxidation state, or by replacing it with an atom of a different element with a different charge. More particularly, the "defect" in a non-stoichiometric $SiO_XN_Y$ involves nanocrystalline particles.

Figure 8B:
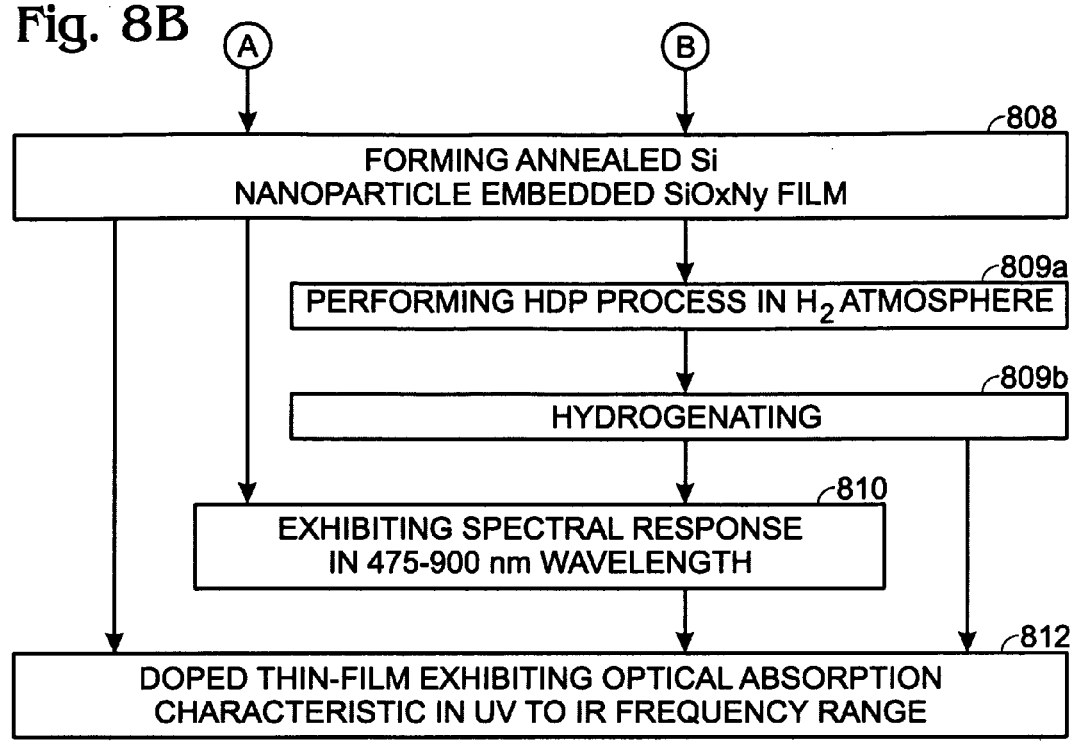

FIGS. 8A and 8B are a flowchart illustrating a method fabricating a high quantum efficiency Si nanoparticle embedded $SiO_XN_Y$ film for luminescence (EL and PL) applications. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 800.

Step 802 provides a bottom electrode. Step 804 deposits a Si nanoparticle embedded non-stoichiometric $SiO_XN_Y$ film, where (X+Y<2 and Y>0), overlying the bottom electrode.

The optical dispersion characteristics of the non-stoichiometric $SiO_XN_Y$ thin-film films can also be tailored by varying the values of X and Y with respect to the thickness of the thin-film. In one aspect, the semiconductor thin-film is deposited by heating an underlying substrate to a temperature of less than about 400° C. Note: in some aspects the bottom electrode and substrate are the same element.

Step 806 anneals the Si nanoparticle embedded $SiO_XN_Y$ film. Step 808 forms an annealed Si nanoparticle embedded $SiO_XN_Y$ film having an extinction coefficient (k) of less than about 0.001 as measured at 632 nanometers (nm), and a PL quantum efficiency (PLQE) of greater than 20%. Alternately, Step 808 forms an annealed Si nanoparticle embedded $SiO_XN_Y$ film having a refractive index (n) in a range of about 1.6 to 1.9, as measured at 632 nm, and a PL quantum efficiency of greater than 20%. In some aspects, the PLQE is greater than 50%. In Step 810 the Si nanoparticle embedded $SiO_XN_Y$ film exhibits a spectral response at a wavelength in the range of about 475 nm to 900 nm.

In one aspect, depositing the Si nanoparticle embedded $SiO_XN_Y$ film in Step 804 includes substeps. Step 804a introduces a Si precursor and hydrogen. Step 804b deposits a $SiO_XN_Y$ thin-film overlying the bottom electrode, using a HDPECVD process. Step 804c supplies power to a top electrode at a frequency in the range of 13.56 to 300 megahertz (MHz), and a power density of less than 5 watts per square centimeter ($W/cm^2$). Step 804d supplies power to a bottom electrode at a frequency in the range of 50 kilohertz to 13.56 MHz, and a power density of up to 3 $W/cm^2$. In one aspect, Step 804a uses an atmosphere pressure in the range of 1 to 500 mTorr, and supplies an oxygen source gas. For example, $N_2O$, NO, $O_2$, or $O_3$ may be used. In another aspect, Step 804a supplies an inert noble gas in addition to the oxygen source gas, Si precursor, and hydrogen.

More explicitly, the Si precursor, hydrogen, and oxygen source gas may be introduced as $SiH_4$, an $N_2O$ oxygen source gas, $H_2$, and an inert gas, in the following ranges:

$SiH_4$ to $N_2O$ ratio of about 0.1 to 10;
$H_2$ to $SiH_4$ ratio of about 0.02 to 100;
inert gas to $SiH_4$ ratio of about 0 to 10;
$N_2O$ to $H_2$ ratio of about 0.02 to 20; and,
inert gas to $H_2$ ratio of about 0 to 40.

Alternately, the oxygen source gas can be $O_2$, and the same ratios apply as above, substituting $O_2$ for $N_2O$.

In one aspect, the HDPECVD process uses an inductively coupled plasma (ICP) source. In another aspect, the HDPECVD process uses a plasma concentration of greater than $1 \times 10^{11}$ $cm^{-3}$, with an electron temperature of less than 10 eV. It should be noted that the Si nanoparticle embedded $SiO_XN_Y$ films may be fabricated by any suitable high density plasma technique operating at RF or microwave frequencies.

In another aspect, supplying the Si precursor and hydrogen in Step 804a includes supplying a precursor such as $Si_nH_{2n+2}$, where n varies from 1 to 4, or $SiH_xR_{4-x}$, where R is Cl, Br, or I, and where x varies from 0 to 3.

The annealed Si nanoparticle embedded $SiO_XN_Y$ film formed in Step 808 may be an intrinsic or doped Si nanoparticle embedded $SiO_XN_Y$ films. If doped, the dopant may be a Type 3, Type 4, Type 5, or rare earth element dopant. Then, in Step 812, the annealed Si nanoparticle embedded $SiO_XN_Y$ film exhibits optical absorption characteristics in the range of frequencies from deep ultraviolet (UV) to far infrared (IR).

In another aspect, annealing the Si nanoparticle embedded $SiO_XN_Y$ film in Step 806 includes using either a flash or laser annealing, with a heat source having a radiation wavelength of either about 150 to 600 nm or about 9 to 11 micrometers. In a different aspect, annealing the Si nanoparticle embedded $SiO_XN_Y$ film includes substeps. Step 806a heats the substrate to a temperature of greater than about 400° C. Step 806b heats for a time duration in the range of about 10 to 300 minutes. Step 806c heats in an atmosphere of oxygen and hydrogen, oxygen, hydrogen, or inert gases. Then, forming the annealed Si nanoparticle embedded $SiO_XN_Y$ film in Step 808 includes modifying the size of the semiconductor nanoparticles in the Si insulating film in response to the annealing.

In another aspect, if Step 802 provides a bottom electrode on a temperature-sensitive substrate such as glass, a metalized substrate, or plastic, then Step 806 may anneal the Si nanoparticle embedded $SiO_XN_Y$ film at a temperature of less than 650° C.

In a different aspect, Step 809a performs a HD plasma treatment on the annealed Si nanoparticle embedded $SiO_XN_Y$ film in an $H_2$ atmosphere, using a substrate temperature of less than 400° C. Step 809b hydrogenates the annealed Si nanoparticle embedded $SiO_XN_Y$ film. For example, the hydrogenating may be accomplished using an HD plasma process as follows:

supplying power to a top electrode at a frequency in the range of 13.56 to 300 MHz, and a power density of up to 10 $W/cm^2$;

supplying power to a bottom electrode at a frequency in the range of 50 kilohertz to 13.56 MHz, and a power density of up to 3 $W/cm^2$;

using an atmosphere pressure in the range of 1 to 500 mTorr; and, supplying an atmosphere or either $H_2$ and an inert gas, or $H_2$.

In another aspect, depositing the Si nanoparticle embedded non-stoichiometric $SiO_XN_Y$ film in Step 804 includes depositing a plurality of $SiO_XN_Y$ films overlying the bottom electrode. In a different aspect, Step 808 forms an annealed Si nanoparticle embedded $SiO_XN_Y$ film having a graded extinction coefficient (k). The k may be graded continuous, or with a stepped or cyclic function. In another aspect, the graded k has a value that varies with the distance of the film from the substrate (bottom electrode).

Figure 9:
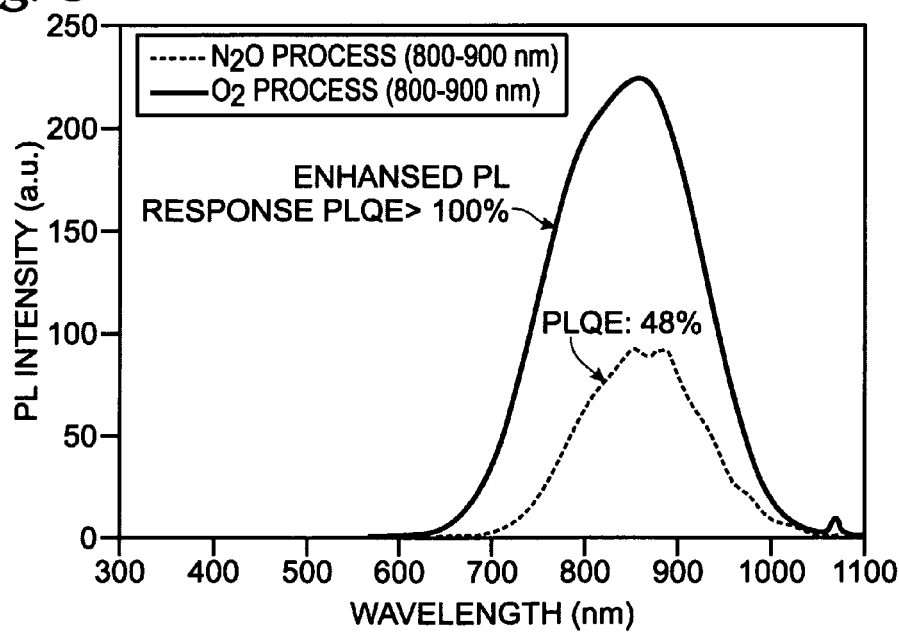
FIG. 9 is a graph depicting PL intensity as a function of wavelength for $SiO_XN_Y$ films fabricated using the above-described HDPECVD process.

FIG. 9 is a graph depicting PL intensity as a function of wavelength for $SiO_XN_Y$ films fabricated using the above-described HDPECVD process. Using $O_2$ as an oxygen source gas, the PLQE exceeds 100%. When $N_2O$ is used, the PLQE is 48%. Thus, it is possible to independently control the optical dispersion and the PL characteristics using the high density plasma technique.

Figure 10:
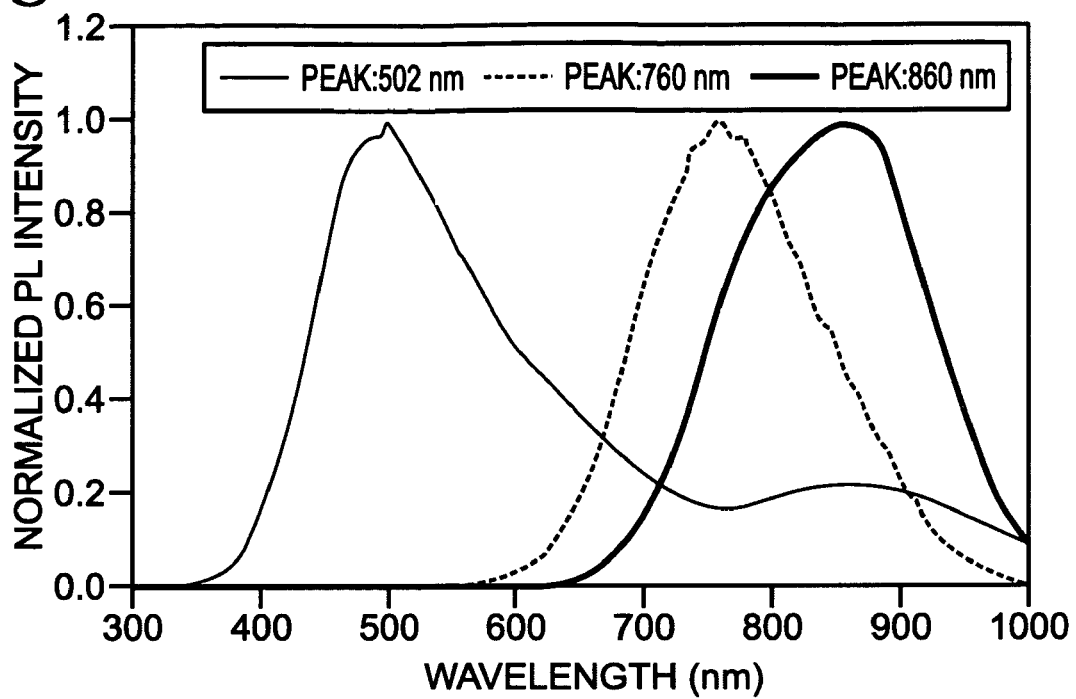
FIG. 10 is a graph depicting the control exhibited on PL wavelength of the nc-Si embedded $SiO_XN_Y$ thin films as fabricated by the HDP technique.

FIG. 10 is a graph depicting the control exhibited on PL wavelength of the nc-Si embedded $SiO_XN_Y$ thin films as fabricated by the HDP technique. The longer wavelength PL corresponds to larger nc-Si sizes.

Luminescence devices have been described that are made with Si nanoparticle embedded $SiO_XN_Y$ films. Specific examples of $SiO_XN_Y$ thin-film fabrication details have been presented. Some details of other specific materials and process details have also been used to illustrate the invention. However, the invention is not limited to merely these examples. Other variations and embodiments of the invention will occur to those skilled in the art.

We claim:

1. A method for fabricating a high quantum efficiency silicon (Si) nanoparticle embedded $SiO_XN_Y$ film for luminescence (electroluminescence—EL and photoluminescence—PL) applications, the method comprising:

providing a bottom electrode;

depositing a Si nanoparticle embedded non-stoichiometric $SiO_XN_Y$ film, where (X+Y<2 and Y>0), overlying the bottom electrode, as follows:

introducing a Si precursor and hydrogen;
depositing a $SiO_XN_Y$ film overlying the bottom electrode, using a high density (HD) plasma-enhanced chemical vapor deposition (PECVD) process; and,
supplying power to a top electrode at a frequency in the range of 13.56 to 300 megahertz (MHz), and a power density of less than 5 watts per square centimeter ($W/cm^2$);
annealing the Si nanoparticle embedded $SiO_XN_Y$ film; and,
forming an annealed Si nanoparticle embedded $SiO_XN_Y$ film having an extinction coefficient (k) of less than about 0.001 as measured at 632 nanometers (nm), and a PL quantum efficiency (PLQE) of greater than 20%.

2. The method of claim 1 further comprising:
supplying power to a bottom electrode at a frequency in the range of 50 kilohertz to 13.56 MHz, and a power density of up to 3 $W/cm^2$;
wherein introducing the Si precursor and hydrogen includes:
using an atmosphere pressure in the range of 1 to 500 mTorr; and,
supplying an oxygen source gas.

3. The method of claim 2 wherein supplying the oxygen source gas includes supplying an oxygen source gas selected from a group consisting of $N_2O$, NO, $O_2$, and $O_3$.

4. The method of claim 2 wherein introducing the Si precursor and hydrogen includes supplying an inert noble gas.

5. The method of claim 2 wherein introducing the Si precursor, hydrogen, and oxygen source gas includes introducing $SiH_4$, an $N_2O$ oxygen source gas, $H_2$, and an inert gas, as follows:
$SiH_4$ to $N_2O$ in a ratio in a range of about 0.1 to 10;
$H_2$ to $SiH_4$ in a ratio in a range of about 0.02 to 100;
inert gas to $SiH_4$ in a ratio in a range of about 0 to 10;
$N_2O$ to $H_2$ in a ratio in a range of about 0.02 to 20; and,
inert gas to $H_2$ in a ratio in a range of about 0 to 40.

6. The method of claim 1 wherein annealing the Si nanoparticle embedded $SiO_XN_Y$ film includes using an annealing process selected from a group consisting of flash and laser annealing, using a heat source having a radiation wavelength selected from a group consisting of about 150 to 600 nm and 9 to 11 micrometers.

7. The method of claim 1 wherein depositing the Si nanoparticle embedded $SiO_XN_Y$ film using the HD PECVD process includes using a plasma concentration of greater than $1 \times 10^{11}$ $cm^{-3}$, with an electron temperature of less than 10 eV.

8. The method of claim 2 wherein introducing the Si precursor, hydrogen, and oxygen source gas includes introducing $SiH_4$, an $O_2$ oxygen source gas, $H_2$, and an inert gas, where
$SiH_4$ to $O_2$ is a ratio in a range of about 0.1 to 10;
$H_2$ to $SiH_4$ is a ratio in a range of about 0.02 to 100;
inert gas to $SiH_4$ is a ratio in a range of about 0 to 10;
$O_2$ to $H_2$ is a ratio in a range of about 0.02 to 20; and,
inert gas to $H_2$ is a ratio in a range of about 0 to 40.

9. The method of claim 1 wherein introducing the Si precursor and hydrogen includes supplying a Si precursor selected from a group consisting of $Si_nH2_{n+2}$, where n varies from 1 to 4, and $SiH_xR_{4-x}$ where R is selected from a first group consisting of Cl, Br, and I, and where x varies from 0 to 3.

10. The method of claim 1 wherein depositing the Si nanoparticle embedded $SiO_XN_Y$ film using an HD PECVD process includes using an inductively coupled plasma (ICP) source.

11. The method of claim 1 further comprising:
the Si nanoparticle embedded $SiO_XN_Y$ film exhibiting a spectral response at a wavelength in a range of about 475 nm to 900 nm.

12. The method of claim 1 wherein depositing the Si nanoparticle embedded $SiO_XN_Y$ film includes heating an underlying substrate to a temperature of less than about 400° C.

13. The method of claim 1 wherein annealing the Si nanoparticle embedded $SiO_XN_Y$ film includes:
heating an underlying substrate to a temperature of greater than about 400° C.;
heating for a time duration in the range of about 10 to 300 minutes;
heating in an atmosphere selected from a group consisting of oxygen and hydrogen, oxygen, hydrogen, and inert gases; and,
wherein forming the annealed Si nanoparticle embedded $SiO_XN_Y$ film includes modifying the size of the Si nanoparticles in the $SiO_XN_Y$ film in response to the annealing.

14. The method of claim 1 wherein providing a bottom electrode includes providing a bottom electrode on a temperature-sensitive substrate selected from a group consisting of glass, metalized substrates, and plastic;
wherein annealing the Si nanoparticle embedded $SiO_XN_Y$ film includes annealing at a temperature of less than 650° C.

15. The method of claim 1 wherein forming an annealed Si nanoparticle embedded $SiO_XN_Y$ film includes forming an annealed Si nanoparticle embedded $SiO_XN_Y$ film elected from a group consisting of intrinsic and doped Si nanoparticle embedded $SiO_XN_Y$ films; and,
the method further comprising:
the doped Si nanoparticle embedded $SiO_XN_Y$ film exhibiting a spectral response at a wavelength in a range of about deep UV to far IR wavelengths.

16. The method of claim 1 further comprising:
performing a HD plasma treatment on the annealed Si nanoparticle embedded $SiO_XN_Y$ film in an $H_2$ atmosphere, using a substrate temperature of less than 400° C.; and,
hydrogenating the annealed Si nanoparticle embedded $SiO_XN_Y$ film.

17. The method of claim 16 wherein hydrogenating the annealed Si nanoparticle embedded $SiO_XN_Y$ film using the HD plasma process includes:
supplying power to a top electrode at a frequency in the range of 13.56 to 300 MHz, and a power density of up to 10 $W/cm^2$;
supplying power to a bottom electrode at a frequency in the range of 50 kilohertz to 13.56 MHz, and a power density of up to 3 $W/cm^2$;
using an atmosphere pressure in the range of 1 to 500 mTorr; and,
supplying an atmosphere selected from a group consisting of $H_2$ and an inert gas, and $H_2$.

18. The method of claim 1 wherein forming the annealed Si nanoparticle embedded $SiO_XN_Y$ film includes forming an annealed Si nanoparticle embedded $SiO_XN_Y$ film having a PLQE of greater than 50%.

19. The method of claim 1 wherein depositing the Si nanoparticle embedded non-stoichiometric $SiO_XN_Y$ film includes depositing a plurality of $SiO_XN_Y$ films overlying the bottom electrode.

20. The method of claim 1 wherein forming the annealed Si nanoparticle embedded $SiO_XN_Y$ film includes forming an annealed Si nanoparticle embedded $SiO_XN_Y$ film having a graded extinction coefficient (k).

21. The method of claim 20 wherein forming the annealed Si nanoparticle embedded $SiO_XN_Y$ film with graded k includes forming a graded k with a function selected from a group consisting of continuous, stepped, and cyclic.

22. The method of claim 20 wherein forming the annealed Si nanoparticle embedded $SiO_XN_Y$ film with graded k includes forming a graded k with a value that varies with the distance of the film from the bottom electrode.

23. A method for fabricating a high quantum efficiency silicon (Si) nanoparticle embedded $SiO_XN_Y$ film for luminescence (electroluminescence—EL and photoluminescence—PL) applications, the method comprising:
    providing a bottom electrode;
    depositing a Si nanoparticle embedded non-stoichiometric $SiO_XN_Y$ film, where (X+Y<2 and Y>0), overlying the bottom electrode;
    annealing the Si nanoparticle embedded $SiO_XN_Y$ film using an annealing process selected from a group consisting of flash and laser annealing, using a heat source having a radiation wavelength selected from a group consisting of about 150 to 600 nm and 9 to 11 micrometers; and,
    forming an annealed Si nanoparticle embedded $SiO_XN_Y$ film having an extinction coefficient (k) of less than about 0.001 as measured at 632 nanometers (nm), and a PL quantum efficiency (PLQE) of greater than 20%.

24. The method of claim 23 further comprising:
    performing a HD plasma treatment on the annealed Si nanoparticle embedded $SiO_XN_Y$ film in an $H_2$ atmosphere, using a substrate temperature of less than 400° C.; and,
    hydrogenating the annealed Si nanoparticle embedded $SiO_XN_Y$ film.

25. A method for fabricating a high quantum efficiency silicon (Si) nanoparticle embedded $SiO_XN_Y$ film for luminescence (electroluminescence—EL and photoluminescence—PL) applications, the method comprising:
    providing a bottom electrode;
    depositing a Si nanoparticle embedded non-stoichiometric $SiO_XN_Y$ film, where (X+Y<2 and Y>0), overlying the bottom electrode;
    annealing the Si nanoparticle embedded $SiO_XN_Y$ film;
    forming an annealed Si nanoparticle embedded $SiO_XN_Y$ film having an extinction coefficient (k) of less than about 0.001 as measured at 632 nanometers (nm), and a PL quantum efficiency (PLQE) of greater than 20%;
    performing a HD plasma treatment on the annealed Si nanoparticle embedded $SiO_XN_Y$ film in an $H_2$ atmosphere, using a substrate temperature of less than 400° C.; and,
    hydrogenating the annealed Si nanoparticle embedded $SiO_XN_Y$ film.

26. The method of claim 25 wherein annealing the Si nanoparticle embedded $SiO_XN_Y$ film includes using an annealing process selected from a group consisting of flash and laser annealing, using a heat source having a radiation wavelength selected from a group consisting of about 150 to 600 nm and 9 to 11 micrometers.

27. A method for fabricating a high quantum efficiency silicon (Si) nanoparticle embedded $SiO_XN_Y$ film for luminescence (electroluminescence—EL and photoluminescence—PL) applications, the method comprising:
    providing a bottom electrode;
    depositing a Si nanoparticle embedded non-stoichiometric $SiO_XN_Y$ film, where (X+Y<2 and Y>0), overlying the bottom electrode;
    annealing the Si nanoparticle embedded $SiO_XN_Y$ film; and,
    forming an annealed Si nanoparticle embedded $SiO_XN_Y$ film having a graded extinction coefficient (k) of less than about 0.001 as measured at 632 nanometers (nm), and a PL quantum efficiency (PLQE) of greater than 20%.

28. The method of claim 27 wherein annealing the Si nanoparticle embedded $SiO_XN_Y$ film includes using an annealing process selected from a group consisting of flash and laser annealing, using a heat source having a radiation wavelength selected from a group consisting of about 150 to 600 nm and 9 to 11 micrometers.

* * * * *